United States Patent
Hashimoto

(10) Patent No.: US 6,867,496 B1
(45) Date of Patent: Mar. 15, 2005

(54) INTERCONNECT SUBSTRATE, SEMICONDUCTOR DEVICE, METHODS OF FABRICATING, INSPECTING, AND MOUNTING THE SEMICONDUCTOR DEVICE, CIRCUIT BOARD, AND ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/856,627

(22) PCT Filed: Sep. 29, 2000

(86) PCT No.: PCT/JP00/06824

§ 371 (c)(1),
(2), (4) Date: May 24, 2001

(87) PCT Pub. No.: WO01/26432

PCT Pub. Date: Apr. 12, 2001

(30) Foreign Application Priority Data

Oct. 1, 1999 (JP) .......................................... 11-281424

(51) Int. Cl.⁷ .......................... H01L 23/48; H01L 23/52; H01L 29/40

(52) U.S. Cl. .................. 257/771; 257/678; 257/680; 257/684; 257/685; 257/686; 257/688; 257/689; 257/690; 257/723; 257/730; 257/731

(58) Field of Search ................. 257/678, 680, 257/684–686, 688–690, 723, 730, 731, 771

(56) References Cited

U.S. PATENT DOCUMENTS

| | | | | | |
|---|---|---|---|---|---|
| 5,117,282 A | * | 5/1992 | Salatino | ...................... | 257/686 |
| 5,157,255 A | * | 10/1992 | Kornrumpf et al. | ..... | 250/252.1 |
| 5,182,632 A | * | 1/1993 | Bechtel et al. | ............... | 257/713 |
| 5,200,810 A | * | 4/1993 | Wojnarowski et al. | ...... | 361/750 |
| 5,202,045 A | * | 4/1993 | Karpusiewicz et al. | ..... | 510/277 |
| 5,224,023 A | * | 6/1993 | Smith et al. | ................. | 361/784 |
| 5,345,205 A | * | 9/1994 | Kornrumpf | ................. | 333/246 |
| 5,436,744 A | * | 7/1995 | Arledge et al. | ............. | 349/150 |
| 5,448,511 A | | 9/1995 | Paurus et al. | | |
| 5,609,488 A | * | 3/1997 | McTaggart | ................... | 434/317 |
| 5,623,160 A | * | 4/1997 | Liberkowski | ............... | 257/621 |
| 5,646,068 A | * | 7/1997 | Wilson et al. | ............. | 438/108 |
| 5,747,858 A | * | 5/1998 | Hawkins | ..................... | 257/417 |
| 5,854,507 A | | 12/1998 | Miremadi et al. | | |
| 6,057,594 A | * | 5/2000 | Chia et al. | .................. | 257/668 |
| 6,069,026 A | * | 5/2000 | Terrill et al. | ................ | 438/109 |
| 6,084,778 A | * | 7/2000 | Malhi | ......................... | 361/749 |
| 6,165,817 A | * | 12/2000 | Akram et al. | ............... | 438/118 |
| 6,372,543 B1 | * | 4/2002 | Chiu et al. | .................. | 438/108 |
| 6,376,352 B1 | * | 4/2002 | Arnold et al. | ............. | 438/612 |

FOREIGN PATENT DOCUMENTS

| | | |
|---|---|---|
| CN | 689502 | 5/1999 |
| EP | 0 571 749 A1 | 12/1993 |
| EP | 1 041 633 A1 | 10/2000 |
| JP | A-52-135066 | 11/1977 |
| JP | U-58-153470 | 10/1983 |
| JP | A-62-191149 | 8/1987 |
| JP | A-62-260353 | 11/1987 |
| JP | U 1-60543 | 4/1989 |
| JP | A 3-245591 | 11/1991 |
| JP | A 4-150055 | 5/1992 |
| JP | A-05-144998 | 6/1993 |
| JP | U-5-55571 | 7/1993 |
| JP | A-10-256788 | 9/1998 |
| JP | A-11-040618 | 2/1999 |
| JP | A-11-069241 | 3/1999 |
| WO | WO 00/14801 | 3/2000 |
| WO | WO 00/14802 | 3/2000 |

* cited by examiner

*Primary Examiner*—Amir Zarabian
*Assistant Examiner*—Ida M. Soward
(74) *Attorney, Agent, or Firm*—Oliff & Berridge, PLC

(57) ABSTRACT

A semiconductor device including a substrate (10). An interconnect pattern (12) is formed over the substrate (10), and the substrate (10) has a first portion (14) and a second portion (16) to be superposed on the first portion (14). The first portion (14) has edges (22), (24), (26) and (28) as positioning references. The second portion (16) has a shape to be superposed over the first portion (14) except the edges (22), (24), (26) and (28).

15 Claims, 7 Drawing Sheets

US 6,867,496 B1

INTERCONNECT SUBSTRATE, SEMICONDUCTOR DEVICE, METHODS OF FABRICATING, INSPECTING, AND MOUNTING THE SEMICONDUCTOR DEVICE, CIRCUIT BOARD, AND ELECTRONIC INSTRUMENT

This application, under 35 U.S.C. §371, is a U.S. National Stage application of PCT/JP00/06624 filed Sep. 29, 2000.

TECHNICAL FIELD

The present invention relates to an interconnect substrate, a semiconductor device, methods of fabricating, inspecting, and mounting the semiconductor device, a circuit board, and an electronic instrument.

BACKGROUND ART

Packages having a structure in which a first portion of a substrate equipped with a semiconductor chip is bent and bonded to a second portion of the substrate provided with external terminals, or in which a first substrate equipped with a semiconductor chip is bonded to a second substrate provided with the external terminals have been developed. Since these packages enable the area of the substrate to be increased while reducing the planar size, the degree of freedom relating to the design of the interconnect pattern increases. Therefore, a stacked structure in which a number of semiconductor chips are superposed one on top of the other can be easily formed.

However, it is difficult to bend and superpose a substrate accurately at a desired position. It is also difficult to bond a plurality of substrates at a precise position. The package shapes may differ from each other since part of a substrate projects from a portion having external terminals when bending and superposing a substrate. In such a case, relative positions of package outline and external terminals may differ from each other, so that the positioning of external terminals with reference to the package outline.

DISCLOSURE OF THE INVENTION

The present invention has been achieved to solve this problem. An objective of the present invention is to provide an interconnect substrate enabling easy positioning, a semiconductor device, methods of fabricating, inspecting, and mounting the semiconductor device, a circuit board, and an electronic instrument.

(1) According to the present invention, there is provided an interconnect substrate over which an interconnect pattern is formed, comprising:
  a first portion; and
  a second portion to be superposed on the first portion,
  wherein the first portion has an end part as a positioning reference; and
  wherein the second portion has a shape so as to be superposed on the first portion except the end part.

Note that the superposed second portion is not always in contact with the first portion. According to the present invention, the second portion has a shape so as to be superposed on the first portion except the end part which is a positioning reference. Therefore, if the second portion is superposed on the first portion, the interconnect substrate can be positioned by using the end part of the first portion as the positioning reference.

(2) In this interconnect substrate, the end part as the positioning reference may include two edges which are perpendicular to each other.

This enables to determine positions by using these two edges.

(3) In this interconnect substrate, the first portion may comprise a rectangular body section and a projected section which extends from at least one edge of the body section and includes the end part.

This enables to determine positions by using the projected section or the two edges of the projected section.

(4) In this interconnect substrate, the projected section may be a region determined by:
  an edge which is a boundary between the projected section and the body section;
  a first edge which is perpendicular to the edge as a boundary; and
  a second top edge which is parallel to the edge as a boundary,
  wherein the end part as a positioning reference may include the first and second edges.

(5) In this interconnect substrate, the body section of the first portion may include an edge having no projected section; and the second portion may be disposed adjacent to the edge having no projected section.

(6) In this interconnect substrate, the second portion may have a depressed section facing the projected section of the first portion.

(7) In this interconnect substrate, the first portion may have a plurality of the end parts as positioning references; and at least one of the end parts may be formed from an area in the body section other than an area from which the projected section extends.

(8) In this interconnect substrate, the first portion may be larger than the second portion; and the two edges which are perpendicular to each other may form a corner section of the first portion.

(9) In this interconnect substrate, the first portion may have a depressed end part including the two edges which are perpendicular to each other and have an right angle.

(10) In this interconnect substrate, a plurality of holes may be formed in the end parts.

(11) In this interconnect substrate, the second portion may continuously extend from the first portion.

(12) In this interconnect substrate, the second portion may be separated from the first portion; and the first and second portions may be connected by the interconnect pattern.

Since the first and second portions are separated, the substrate can be easily bent or folded in the region between the first and second portions.

(13) According to the present invention, there is provided a semiconductor device comprising: at least one semiconductor chip; and
  a substrate which has a first portion and a second portion to be superposed on the first portion, and on which the semiconductor chip is mounted,
  wherein the first portion includes an end part as a positioning reference; and
  wherein the second portion has a shape which avoids being superposed on the end part of the first portion.

Note that the superposed second portion is not always in contact with the first portion. According to the present invention, the second portion has a shape which avoids being superposed on the end part as a positioning reference. Therefore, if the second portion is superposed on the first portion, the interconnect substrate can be positioned by using the end part of the first portion as the positioning reference.

(14) In this semiconductor device, a plurality of external terminals may be provided in the first portion.

According to this configuration, the relative positions between the end part as a positioning reference in the first portion and the external terminals are fixed, therefore the positioning of the external terminals can be easily done by using the end part as a positioning reference. If the electrical characteristics of the semiconductor device are inspected, it is sufficient to put the semiconductor device into a socket. Moreover, rate of defectives due to mispositioning of the external terminals can be reduced when mounting the semiconductor device on a circuit board.

(15) In this semiconductor device, the interconnect substrate may be used as the substrate.

(16) Over a circuit board according to the present invention the above-described semiconductor device is mounted.

(17) An electronic instrument according to the present invention is provided with the above-described semiconductor device.

(18) According to the present invention, there is provided a method of fabricating a semiconductor device, comprising the steps of:
  mounting at least one semiconductor chip over the interconnect substrate as defined in any one of claims 1 to 10; and
  superposing the second portion on the first portion of the interconnect substrate.

Note that the superposed second portion is not always in contact with the first portion. According to the present invention, the second portion has a shape to be superposed on the first portion except the end part as the positioning reference. According to the semiconductor device obtained in this manner, if the second portion is superposed on the first portion, the positioning of the interconnect substrate can be done by using the end part of the first portion as the positioning reference.

(19) According to the present invention, there is provided a method of inspecting a semiconductor device comprising the steps of:
  positioning the above-described semiconductor device by using a plurality of end parts as positioning references; and
  inspecting electrical characteristics of the semiconductor device.

According to the present invention, the positioning and inspection can be done by using the end parts of the first portion as the positioning reference.

(20) According to the present invention, there is provided a method of mounting a semiconductor device, comprising the steps of:
  positioning the above-described semiconductor device by using a plurality of end parts as positioning references; and
  mounting the semiconductor device on a circuit board.

According to the present invention, the positioning for the mounting can be easily done by using the end parts of the first portion as the positioning references.

BEST MODE FOR CARRYING OUT THE INVENTION

Embodiments of the present invention are described below with reference to the drawings.

First Embodiment

Figure 1:
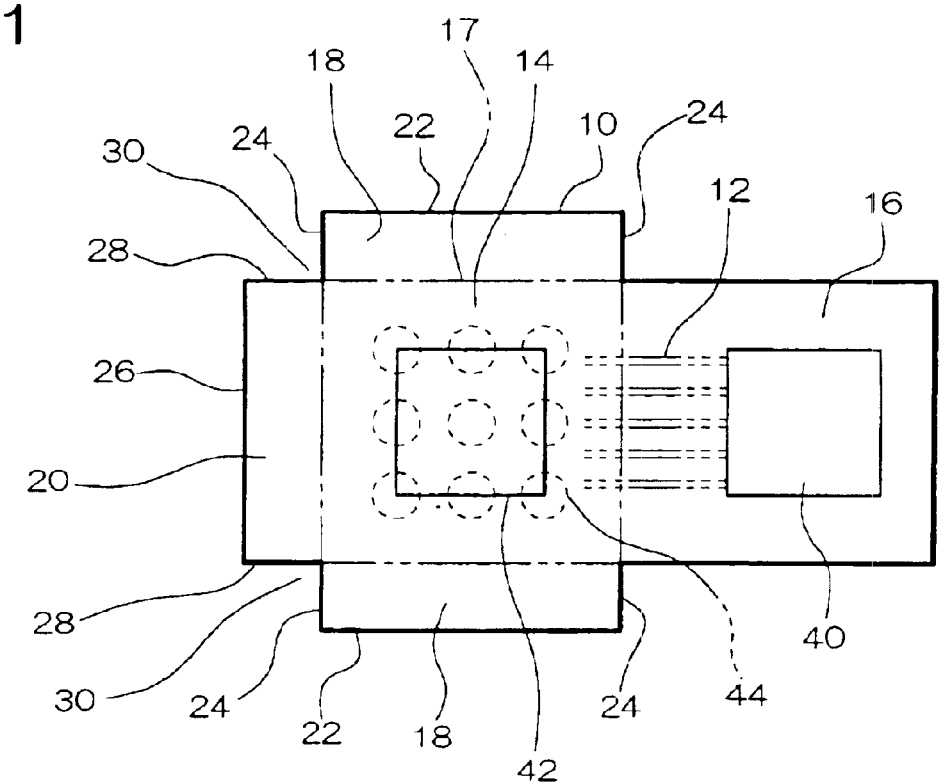
FIG. 1 is illustrative of a method of fabricating a semiconductor device according to a first embodiment of the present invention.
Figure 2:
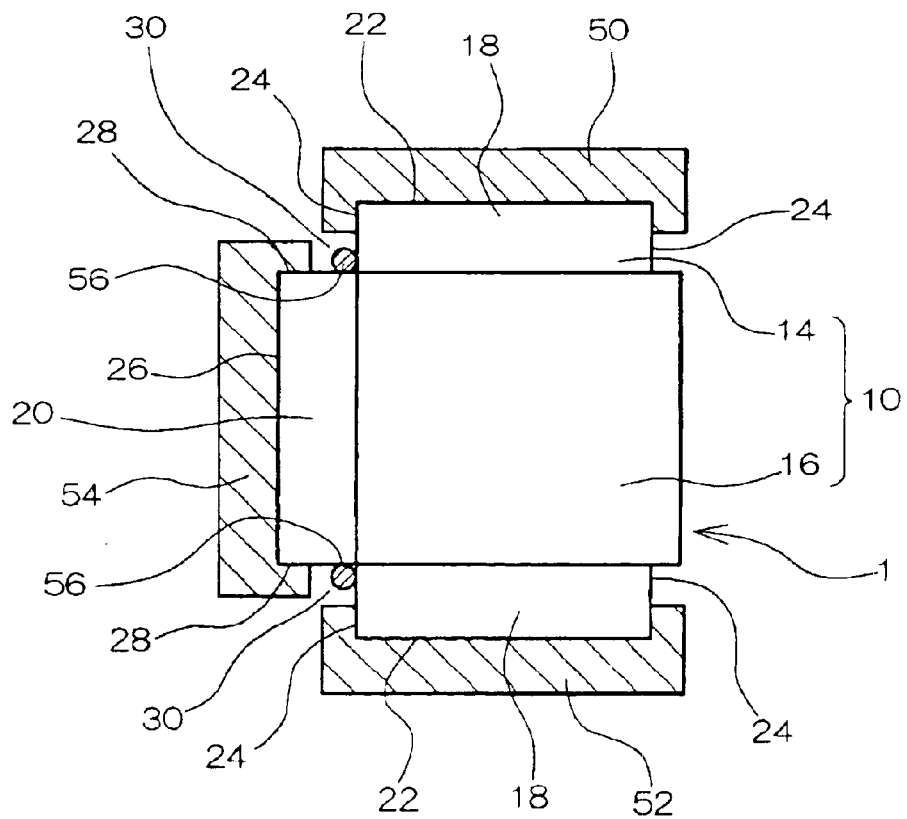
FIG. 2 is illustrative of a semiconductor device and methods of inspecting and mounting a semiconductor device according to the first embodiment to which the present invention.
Figure 3:
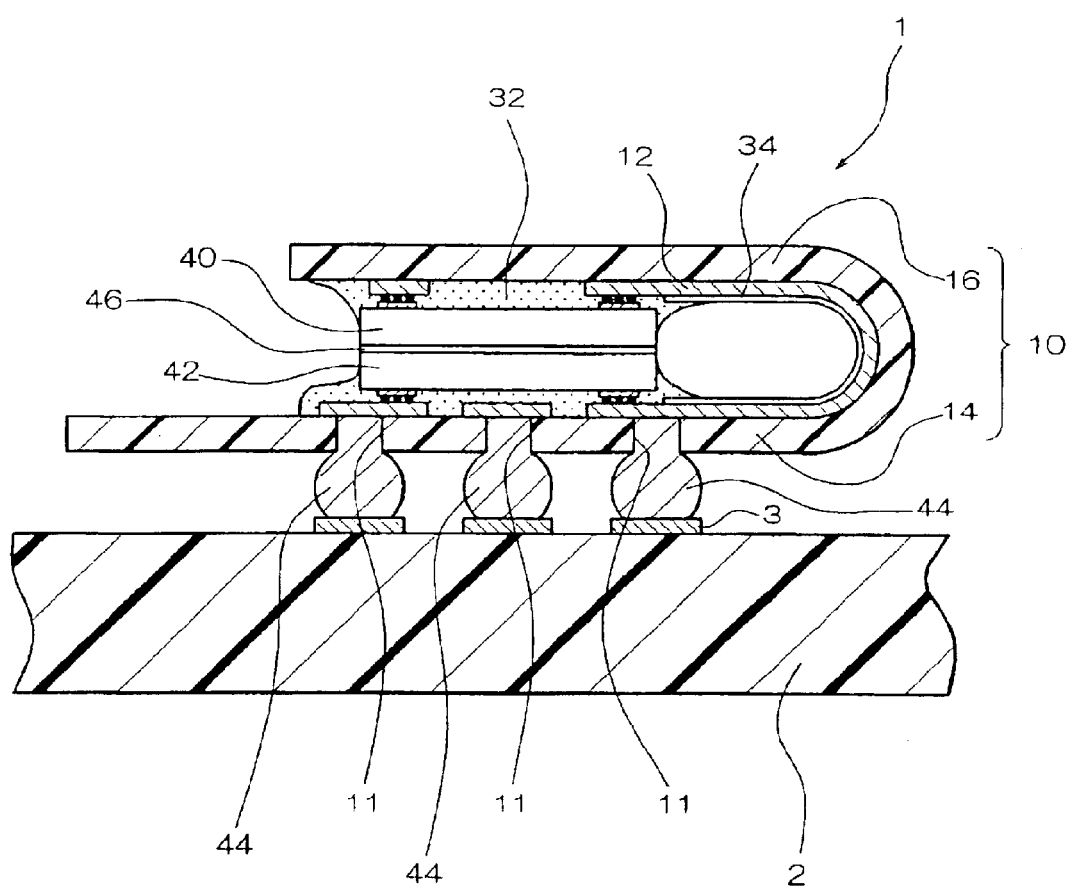
FIG. 3 shows a circuit board equipped with the semiconductor device according to the first embodiment of the present invention.

FIG. 1 is a view illustrating a method of fabricating a semiconductor device according to a first embodiment to which the present invention is applied. FIG. 2 is a view illustrating a semiconductor device according to the present embodiment and a method for inspecting or mounting the semiconductor device. FIG. 3 is a view showing a circuit board equipped with the semiconductor device according to the present embodiment.

Substrate

A substrate 10 shown in FIG. 1 is used in the semiconductor device according to the present embodiment. The substrate 10 is used as an interposer for mounting at least one (plurality in FIG. 1) of semiconductor chips 40 and 42. The material for the substrate 10 may be any organic or inorganic material or a composite structure of these materials. As examples of the substrate 10 formed using an organic material, a two-layer or three-layer flexible substrate formed of a polyimide resin and the like can be given. It is preferable to use a flexible substrate in the case of bending the substrate 10. As the flexible substrate, a substrate called an FPC (Flexible Printed Circuit), a substrate called a glass epoxy tape, or a tape substrate used in TAB (Tape Automated Bonding) technology may be used. As examples of the substrate 10 formed using an inorganic material, a ceramic substrate, a glass substrate, and the like can be given. As examples of a substrate formed of a composite structure of organic and inorganic materials, a glass epoxy substrate and the like can be given. These substrates may be multilayer substrates or built-up substrates.

An interconnect pattern 12 is formed on one edge of the substrate 10. The interconnect pattern 12 may be formed using a conductive material such as copper. The interconnect pattern 12 is preferably plated with solder, tin, gold, nickel, or a composite material of these. The substrate 10 with the interconnect pattern 12 formed thereon may be called an interconnect substrate.

The interconnect pattern 12 may be bonded to the substrate 10 through an adhesive (not shown), thereby forming a three-layer substrate. The interconnect pattern 12 may be formed on the substrate 10 without using an adhesive, thereby forming a two-layer substrate. The interconnect pattern 12 is preferably covered with a protective layer such as resist (not shown) in the area excluding the electrical connections such as land sections.

The substrate 10 includes a first portion 14 and a second portion 16. The second portion 16 is superposed on the first portion 14, as shown in FIG. 2. Specifically, the second portion 16 is superposed on the first portion 14 by bending or folding the substrate 10 in the region between the first and second portions 14 and 16. The first and second portions 14 and 16 may be separated but connected by the interconnect pattern 12. An example of the latter case is described in the next embodiment. Although the first and second portions 14 and 16 come into contact with each other and have an overlapping section, these portions may not be in contact with each other.

The first portion 14 includes a rectangular body section 17 and at least one (plurality in FIG. 1) projected section 18. The projected sections 18 are formed so as to extend from the edge of the body section 17. In the example shown in FIG. 1, the projected sections 18 are formed so as to extend from one edge (virtual edge) of the rectangular body section 17 in a direction perpendicular thereto. However, the projected sections 18 may be formed so as to extend in a direction other than the perpendicular. In FIG. 1, assuming that the region of the first portion 14 continuously formed with the second portion 16 with the same width is the body section 17, the projected sections 18 are formed on the two parallel edges (top and bottom edges in FIG. 1) of the rectangular body section 17. A projected section 20 is formed from the region consisting of the two projected sections 18 and the body section 17 in a direction opposite to the second portion 16.

The projected sections 18 have a top edge 22 parallel to one edge of the body section 17 and edges 24 extending from the edge of the body section 17 in a direction perpendicular thereto. Specifically, the edges 22 and 24 are perpendicular to each other. The projected section 20 has an edge 26 parallel to one edge of the body section 17 and edges 28 extending from the edge of the body section 17 in a direction perpendicular thereto. The edges 26 and 28 are perpendicular to each other. Lines extending from the edge 22 of the projected section 18 and the edge 26 of the projected section 20 are perpendicular to each other.

The edge 24 of the projected section 18 and the edge 28 of the projected section 20 form a concave end part 30. The angle formed by the edge 24 and the edge 28 is a right angle.

The end part including the edges 22 and 24 of the projected section 18, the end part including the edges 26 and 28 of the projected section 20, the end part including the edges 24 and 28 of the projected sections 18 and 20, or the end part including the edges 22 and 26 of the projected sections 18 and 20 becomes a positioning reference. Specifically, among the two edges 22 and 24 perpendicular to each other, the two edges 26 and 28 perpendicular to each other, the two edges 24 and 28 perpendicular to each other, and the two edges 22 and 26 perpendicular to each other, at least one pair of two edges becomes the positioning reference.

Since relative positions of the positioning references and the external terminals are fixed, the accurate position of the external terminals can be easily determined from the outline of the substrate including the positioning references when inspecting or mounting the semiconductor device described later.

A plurality of external terminals 44 is provided on the first portion 14. At least one semiconductor chip 42 may be mounted on the first portion 14. The mounting type of the semiconductor chip 42 is described later in the description of the semiconductor device.

The second portion 16 is shaped so as to be superposed on the first portion 14 in the area other than the above-described end parts which become the positioning references. In the example shown in FIG. 1, the second portion 16 has a shape similar to that of the region of the first portion 14 excluding the projected sections 18 and 20. Since the second portion 16 has such a shape, the second portion 16 does not overlap the end parts of the first portion 14 which become the positioning references when superposing the second portion 16 on the first portion 14, as shown in FIG. 2.

The second portion 16 is disposed adjacent to the body section 17 which is defined in the description of the projected sections 18 of the first portion 14 in the area other than the projected sections 18. In the example shown in FIG. 1, the second portion 16 is continuously and integrally formed with the first portion 14. A slit (not shown) may be formed between the first and second portions 14 and 16. The substrate 10 can be easily bent or folded in the region between the first and second portions 14 and 16 by forming a slit.

At least one semiconductor chip 40 is mounted on the second portion 16. The mounting type of the semiconductor chip 40 is described later in the description of the semiconductor device.

Note that the above-described body section 17 is only an example and the definition of the body section is not limited thereto. In FIG. 1, assuming that the region of the first portion 14 continuously formed with the second portion 16 with the same width (region including the projected section 20) is the body section, the projected sections 18 are formed on two parallel edges (top and bottom edges in FIG. 1) of the body section. Assuming that the region including the two projected sections 18 and the region connecting these projected sections 18 with the same width as the projected sections 18 is the body section, the projected section 20 is formed on the body section in a direction opposite to the second portion 16. In both cases, each of the projected sections 18 and 20 extends from one edge of the rectangular body section so as to have a width smaller than the length of the edge (virtual edge) of the body section.

The body section may be referred to as a rectangular section surrounded by the projected sections 18 and 20 (body section 17, for example) irrespective of the width of the second portion 16.

Fabrication Method for Semiconductor Device

In the method of fabricating the semiconductor device according to the present embodiment, at least one of the semiconductor chips 40 and 42 is mounted on the substrate 10. For example, the semiconductor chip 42 is mounted on the first portion 14 of the substrate 10 and the semiconductor chip 40 is mounted on the second portion 16. This step is carried out while allowing the substrate 10 to extend without bending.

The second portion 16 is then superposed on the first portion 14. For example, the second portion 16 is superposed on the first portion 14 by bending or folding the substrate 10 in the region between the first and second portions 14 and 16.

The method may include a step of providing a plurality of external terminals 44 (see FIG. 3). For example, the external terminals 44 are formed through through-holes 11 formed in the substrate 10 so as to project from the edge of the substrate opposite to the edge on which the interconnect pattern 12 is formed. The external terminals 44 may be formed using solder or the like. Balls may be formed due to surface tension by melting solder provided in the through-holes 11. The through-holes 11 may be filled with a conductive material and solder balls may be placed on the conductive material. In addition, the inner surface of the through-holes 11 may be plated.

In this case, the positions of the through-holes 11 correspond to the positions at which the external terminals are formed. Therefore, the positioning references of the substrate and the positions for the external terminals can be determined more accurately by stamping the positioning references and the through-holes 11 in the same step using a die when fabricating the substrate. In the case where the positioning references and the through-holes 11 cannot be formed in the same step, positioning reference holes may be simultaneously formed with the through-holes 11, and the positioning references of the substrate may be formed based on the positioning reference holes.

Semiconductor Device

FIG. 3 is a view showing the semiconductor device according to the present embodiment. The semiconductor device includes the substrate 10 and at least one of the semiconductor chips 40 and 42. The substrate 10 is the same as described above.

A plurality of through-holes 11 is formed in the substrate 10. The through-holes 11 are used to connect a plurality of external terminals 44 to the interconnect pattern 12. The external terminals 44 projecting from the edge of the substrate 10 opposite to the edge on which the interconnect pattern 12 is formed can be electrically connected to the interconnect pattern 12 through the through-holes 11. For example, in the case where the interconnect pattern 12 extends over the through-holes 11, the external terminals 44 can be provided on the interconnect pattern 12 through the through-holes 11.

The external terminals 44 are formed using solder or the like. Balls may be formed due to surface tension by melting solder with which the through-holes 11 are filled. Solder balls may be placed on a conductive material provided in the through-holes 11. The inner surfaces of the through-holes 11 may be plated.

The interconnect pattern 12 formed to extend over the through-holes 11 may be bent into the through-holes 11 and used as an external terminal. For example, part of the interconnect pattern 12 may be pushed into the through-holes 11 using a die or the like, thereby causing the interconnect pattern 12 to project as an external terminal from the edge of the substrate 10 opposite to the edge on which the interconnect pattern 12 is formed. Instead of positively forming the external terminals, the external terminals may be formed using solder cream applied to a motherboard when mounting the semiconductor device on the motherboard due to surface tension during melting. This semiconductor device is a land grid array semiconductor device in which land sections for forming the external terminals are formed on the edge to be mounted on a circuit board.

The semiconductor chips 40 and 42 are stacked by bending the substrate 10, as shown in FIG. 3. This enables the semiconductor device to be miniaturized. It is preferable that the semiconductor chips 40 and 42 be bonded using an adhesive 46 or the like or secured by a mechanical method.

In the present embodiment, the semiconductor chips 40 and 42 are bonded to the interconnect pattern 12 by using an anisotropic conductive film 32. The mounting type of the semiconductor chip 40 is not particularly limited. In the case of applying face down bonding, the semiconductor chip 40 is mounted on the interconnect pattern 12. Electrodes (preferably bumps) of the semiconductor chip 40 are bonded to the interconnect pattern 12. The electrodes may be bonded using an anisotropic conductive adhesive or conductive resin paste (resin containing silver paste) other than the anisotropic conductive film 32. The electrodes (preferably bumps) may be bonded to the interconnect pattern 12 by using a metal junction such as Au—Au, Au—Sn, or solder, or the shrinkage force of an insulating resin. Face up mounting using wire bonding or TAB mounting technique by connecting fingers may also be applied.

Part of the interconnect pattern 12 formed on the first portion 14 and part of the pattern formed on the second portion 16 may be mirror-symmetrical or have the same shape. This enables design data and a mask used when forming the interconnect pattern 12 on the substrate 10 to be commonly used, thereby reducing the initial cost for fabricating the interconnect substrate.

In the present embodiment, the substrate 10 is bent, with the edge on which the semiconductor chips 40 and 42 are mounted being the inner edge. The substrate 10 is bent in the area between the two semiconductor chips 40 and 42. As shown in FIG. 2, the second portion 16 is superposed on the first portion 14 of the substrate 10 so as not to overlap the projected sections 18 and 20. Therefore, the semiconductor device can be easily positioned by utilizing at least two edges which are perpendicular to each other among the edges 22, 24, 26, and 28 of the projected sections 18 and 20.

In the case where the interconnect pattern 12 is partly mirror-symmetrical on the first and second portions 14 and 16, the semiconductor chips 40 and 42 may have a mirror-symmetrical circuit structure. In the case where the interconnect pattern 12 partly has the same shape on the first and second portions 14 and 16, the semiconductor chips 40 and 42 may have the same circuit structure.

In the case where the semiconductor chips 40 and 42 have a mirror-symmetrical circuit structure or the same circuit structure, each element can be electrically connected from the same external terminals 44. In the case where the semiconductor chips 40 and 42 are memories, address terminals and data terminals are easily shared using the same external terminal 44.

For example, in the case where the semiconductor chips 40 and 42 are memories, information can be read out from or written into memory cells of each memory at the same address from the same external terminal 44. A plurality of (two, for example) semiconductor chips can be separately controlled using the same external terminal arrangement by separating the semiconductor chips 40 and 42 merely by the connection of a chip-select terminal.

According to the present embodiment, a semiconductor device with a stacked structure can be fabricated using a cheap single-edged substrate, whereby cost can be reduced. The description given in the present embodiment may be applied to other embodiments to a large extent.

In the present embodiment, a semiconductor device having external terminals is described. Part of the substrate may be extended and the external connection may be established therefrom. Part of the substrate may be used as leads for connectors, or connectors may be mounted on the substrate. In addition, the interconnect pattern of the substrate may be connected to other electronic instruments.

Inspecting Method for Semiconductor Device

FIG. 2 is a view illustrating a method of inspecting the semiconductor device according to the present embodiment. The semiconductor device according to the present embodiment is designed so as to be positioned by utilizing the projected sections 18 and 20 of the first portion 14 of the substrate 10, as described above. Therefore, the electrical characteristics of the semiconductor device can be easily inspected by putting the semiconductor device into a socket (not shown).

In the example shown in FIG. 2, the socket (not shown) has guides 50, 52, and 54. The guides 50 and 52 engage with the projected sections 18, and the guide 54 engages with the projected section 20. The socket may have pins 56 in addition to or in place of the guides 50, 52, and 54. The pins 56 come in contact with the two depressed sections 30 formed by the projected section 20 and the projected sections 18 (formed by the edges 24 and 28 which are perpendicular to each other).

The positioning of the semiconductor device 1 can be easily carried out by allowing two edges which are perpendicular to each other among the edges 22, 24, 26, and 28 of the projected sections 18 and 20 to engage with at least one of the guides 50, 52, and 54 or the pair of pins 56. The guides 50, 52, and 54 need not be concave as shown in FIG. 2 insofar as the guides can secure at least two edges. As shown in FIG. 2, at least two pins 56 may be used as the guides. Since the area for establishing electrical connection with the inedge of the semiconductor device 1 such as the external terminals 44 and the position of a probe or socket can be determined in this manner, the semiconductor device 1 can be inspected using the probe or socket.

Mounting Method for Semiconductor Device and Circuit Board

FIG. 3 is a view showing a circuit board equipped with the semiconductor device according to the present embodiment. In FIG. 3, the semiconductor device 1 is mounted on a circuit board 2. A glass epoxy substrate or the like is generally used as the circuit board 2. Interconnect pattern 3 is formed on the circuit board 2 by using copper or the like so as to form a desired circuit. Electrical conductivity between the semiconductor device 1 and the circuit board 2 is established by connecting the interconnect pattern 3 to the external terminals of the semiconductor device 1.

The semiconductor device 1 can be easily positioned in the same manner as described for the inspecting method for the semiconductor device. Therefore, a portion for establishing electrical connection such as the external terminals 44 can be bonded to the interconnect pattern 3 of the circuit board 2 with high accuracy, whereby the occurrence of failure due to mispositioning can be reduced. Specifically, relative positions between the components (including the external terminals 44) and the above-described positioning structure in a plan view is accurately determined, the external terminals 44 can be accurately bonded to the interconnect pattern 3 by making a mounting device for the semiconductor device such as a chip mounter recognize the positioning structure.

The present invention is not limited to the above embodiment and various modifications are possible. Other embodiments are described below.

Second Embodiment

Figure 4:
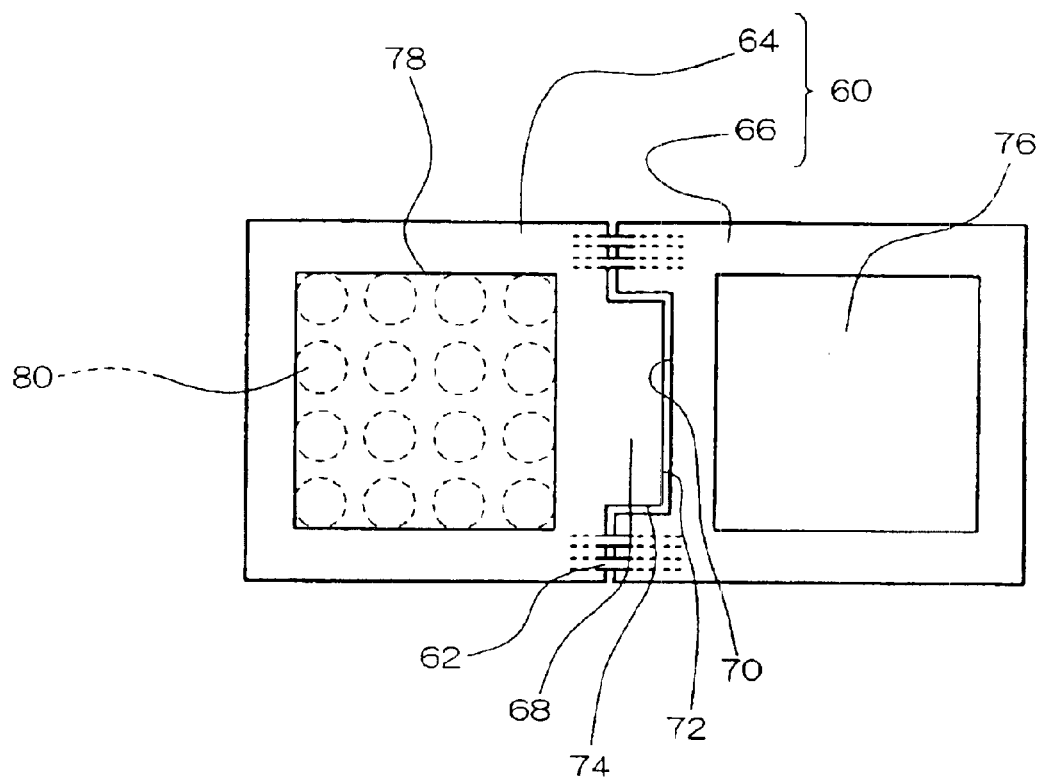
FIG. 4 is illustrative of a method of fabricating a semiconductor device according to a second embodiment of the present invention.
Figure 5:
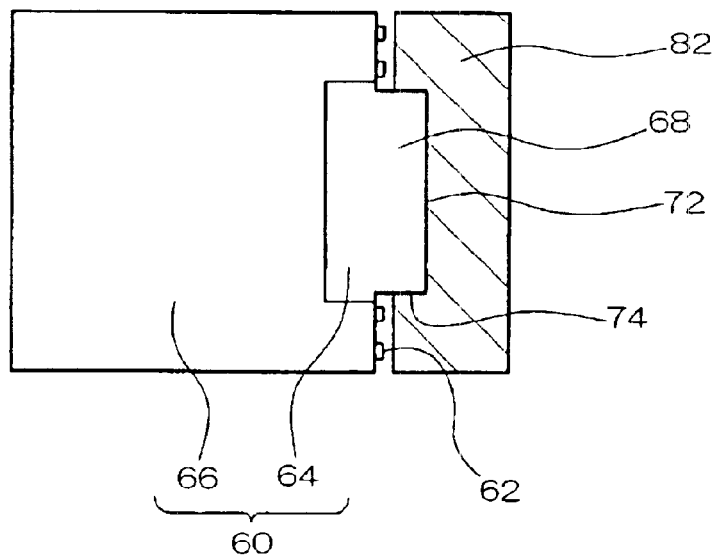
FIG. 5 is illustrative of a semiconductor device and methods of inspecting and mounting a semiconductor device according to second embodiment of the present invention.
Figure 6:
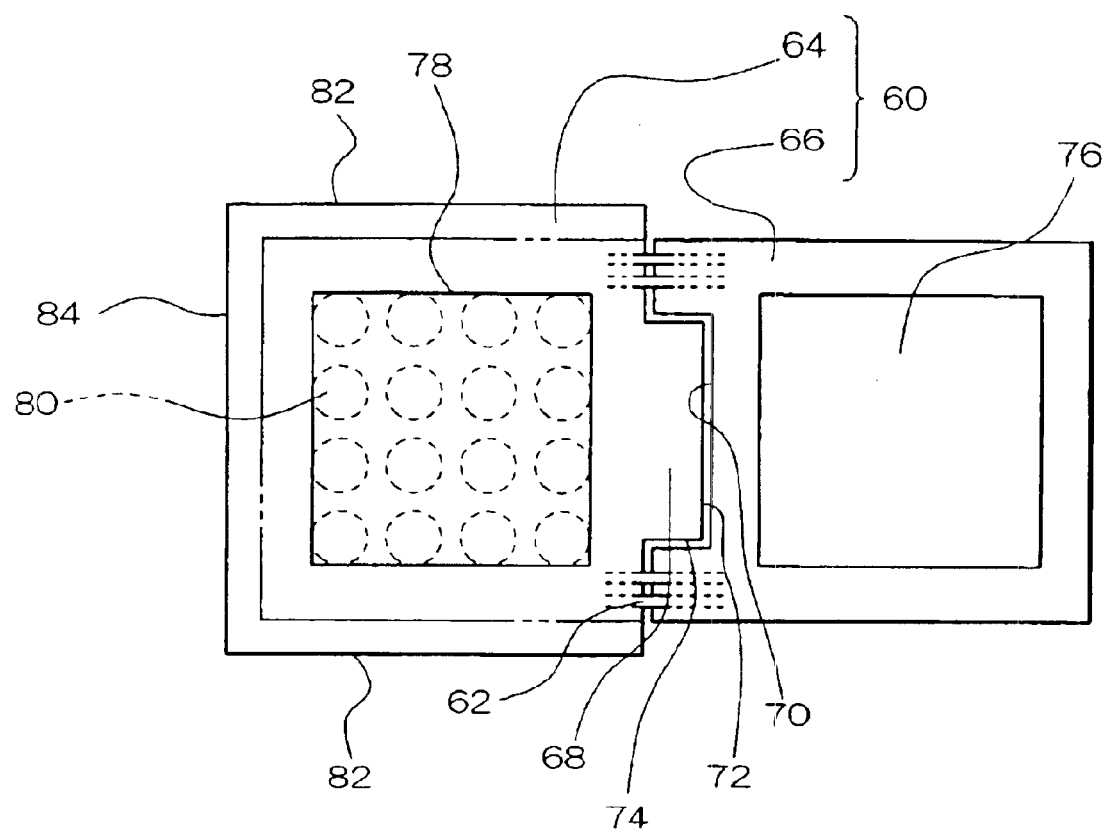
FIG. 6 is illustrative of a semiconductor device according to a modification of the second embodiment of the present invention.

FIG. 4 is a view illustrating a method of fabricating a semiconductor device according to a second embodiment to which the present invention is applied. FIG. 5 is a view illustrating a semiconductor device according to the present embodiment and a method for inspecting or mounting the semiconductor device. FIG. 6 is a view illustrating a method of fabricating a semiconductor device according to a modification example of the present embodiment.

In the present embodiment, a substrate 60 shown in FIG. 4 is used. Interconnect pattern 62 is formed on the substrate 60. The substrate 60 has first and second portions 64 and 66. The first and second portions 64 and 66 are formed separately but connected by the interconnect pattern 62. The interconnect pattern 62 is preferably insulated by applying flexible resist thereon.

The first portion 64 has a projected section 68 which extends from one edge (virtual edge) of a rectangular body section in a direction perpendicular thereto and has a width smaller than the length of the edge of the body section. An edge 72 at the top of the projected section 68 and an edge 74 extending in a direction perpendicular to the edge of the body section intersect at right angles. Therefore, the positioning of the external terminals 80 and other components such as an inspection device or interconnect pattern 3 (see FIG. 3) can be easily done at the time of inspecting or mounting the semiconductor device by using the projected section 68, specifically, the edges 72 and 74 of the projected section 68 perpendicular to each other. A plurality of end parts which form the edges 72 and 74 becomes positioning references.

The second portion 66 has a depressed section 70 with a shape avoiding the projected section 68 of the first portion 64. The depressed section 70 is disposed so as to face the projected section 68. Specifically, the projected section 68 is disposed inedge the depressed section 70. Therefore, the second portion 66 is shaped so as to be superposed on the first portion 64 in the area other than the end parts (end part which forms the edges 72 and 74 or projected section 68) which become the positioning references. Not only the first portion 64 but also the second portion 66 may be used as the positioning references.

The description of the substrate 10 in the first embodiment is applicable to other structures of the substrate 60.

In the method of fabricating the semiconductor device according to the present embodiment, at least one of semiconductor chips 76 and 78 is mounted on the substrate 60. For example, the semiconductor chip 78 is mounted on the first portion 64 of the substrate 60 and the semiconductor chip 76 is mounted on the second portion 66. This step is carried out while allowing the substrate 60 to extend without bending.

The second portion 66 is then superposed on the first portion 64. In the present embodiment, since the first and second portions 64 and 66 are separated, the second portion 66 is superposed on the first portion 64 by bending or folding the interconnect pattern 62.

The method may include a step of providing a plurality of external terminals 80. The description of the external terminals 44 in the first embodiment is applicable to the details of the external terminals 80.

According to the semiconductor device fabricated in this manner, the projected section 68 is formed on the first portion 64 and the second portion 66 is superposed on the first portion 64 in the area other than the projected section 68, as shown in FIG. 5. Therefore, the semiconductor device can be easily positioned using the projected section 68. For example, the semiconductor device can be positioned by allowing a guide 82 to engage with the projected section 68. The description in the first embodiment is applicable to the details therefor.

According to the present embodiment, since the semiconductor device can be easily positioned, the inspecting and mounting steps of the semiconductor device can be performed with high accuracy. The description in the first embodiment is applicable to the details thereof.

As a modification example of the present embodiment, the first portion 64 may have at least one end part for the positioning reference, the one end part extending from an area in the rectangular body section other than an area from which the projected section 68 extends. Specifically, the first portion 64 has a plurality of end parts which become the positioning references, wherein at least one end part is formed by the projected section 68 and at least one other end part is formed from the area other than the area from which the projected section 68 is formed. In the example shown in FIG. 6, the end part for the positioning reference, which is formed from the area other than the area from which the projected section 68 is formed, is formed by edges 82 and 84 which form the outline of the first portion 64. The edges 82 and 84 extend so as to be perpendicular to each other.

As indicated by the dash-double-dotted line shown in FIG. 6, the first portion 64 may be shaped so that all edges of the body section except for the projected section 68 (three edges) are located outedge the second portion 66 when superposing the second portion 66. The first portion 64 may be shaped so that two adjacent edges of the body section except for the projected section 68 are present outedge the second portion 66. This enables the position of the semiconductor device to be recognized two-dimensionally with ease when inspecting or mounting the semiconductor device using at least two adjacent edges of the first portion 64 as the references.

The semiconductor device may be positioned by allowing the end part to engage with a guide such as a socket, or by recognizing the edges 82 and 84 of the first portion 64 as images using a camera or the like. The positioning of the semiconductor device by image recognition is applicable to other embodiments. Positioning accuracy of the semiconductor device may be further improved by using the end part including the edges 82 and 84 which are perpendicular to each other, and using a plurality of end parts or the projected section 68 including the edges 72 and 74.

Third Embodiment

Figure 7:
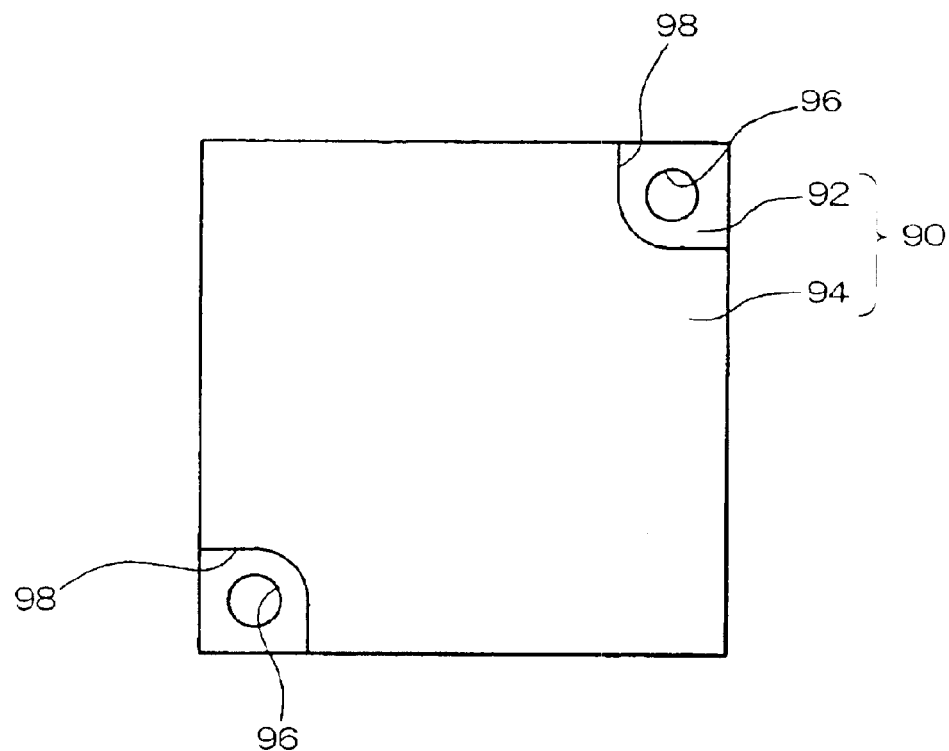
FIG. 7 shows a semiconductor device according to a third embodiment of the present invention.

FIG. 7 is a view showing a semiconductor device according to a third embodiment to which the present invention is applied. This semiconductor device includes a substrate 90 having first and second portions 92 and 94. The first and second portions 92 and 94 are stacked. The first and second portions 92 and 94 may be formed either continuously and integrally or separately. The details thereof are described in the first and second embodiments. At least one semiconductor chip (not shown) is provided between the first and second portions 92 and 94. External terminals (not shown) may be provided on the first portion 92.

In the present embodiment, a plurality of holes 96 is formed on the first portion 92. A plurality of end parts for forming the holes 96 becomes the positioning references of the semiconductor device. Specifically, the semiconductor device can be easily positioned by inserting pins or the like into the holes 96.

The second portion 94 is designed so that the second portion 94 is superposed on the first portion 92 in the area other than the holes 96 on the first portion 92 (or end parts for forming the holes). In the example shown in FIG. 7, notches are formed on the second portion 94 corresponding to the regions of the first portion 92 in which the holes 96 are formed.

In the present embodiment, since the semiconductor device has a plurality of end parts (end parts in which the holes 96 are formed) which become the positioning references, the external terminals (not shown) can be accurately inspected using the inspection device, or mounted on the interconnect pattern 3 (see FIG. 3) using the end parts at the time of inspecting or mounting the semiconductor device. If sections (corner of the substrate, projected section, depressed section, and the like) which can be distinguished from their appearance are formed on the first portion 92 instead of the holes 96, these sections can be used as the positioning references.

Fourth Embodiment

Figure 8:
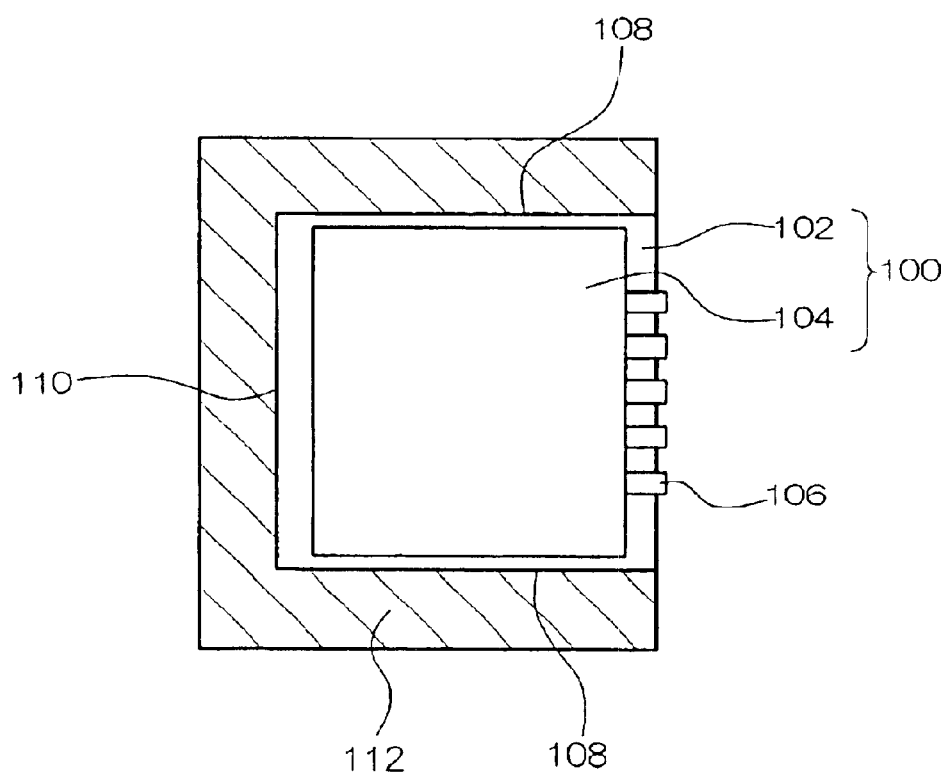
FIG. 8 is illustrative of a semiconductor device and methods of inspecting and mounting the semiconductor device according to a fourth embodiment of the present invention.

FIG. 8 is a view showing a semiconductor device according to a fourth embodiment to which the present invention is applied. This semiconductor device includes a substrate 100 having first and second portions 102 and 104. The first and second portions 102 and 104 are stacked. The first and second portions 102 and 104 may be continuously and integrally formed. In the example shown in FIG. 8, the first and second portions 102 and 104 are separated but connected by the interconnect pattern 106. The details thereof are described in the first and second embodiments. At least one semiconductor chip (not shown) is provided between the first and second portions 102 and 104. External terminals (not shown) may be provided on the first portion 102.

In the present embodiment, the first portion 102 is larger than the second portion 104. Two edges 108 and 110 among the edges which forms the outline of the first portion 102 extend to be perpendicular to each other. The edges 108 and 110 which are perpendicular to each other may form a corner section of the first portion 102. End parts including the edges 108 and 110 which are perpendicular to each other function as the positioning references for the semiconductor device by engaging the end parts with a guide 112 such as a socket.

Since the second portion 104 is smaller than the first portion 102, the second portion 104 is shaped so as to be superposed on the first portion 102 in the area other than the end parts which become the positioning references.

According to the present embodiment, the external terminals (not shown) can be accurately inspected using the inspection device or mounted on the interconnect pattern 3 (see FIG. 3) when inspecting or mounting the semiconductor device by using the edges 108 and 110 which are perpendicular to each other among the edges which forms the outline of the first portion 102 or by using end parts including these edges.

In the present embodiment, the first portion described in the second embodiment may be formed and used as the positioning structure.

Fifth Embodiment

Figure 9:
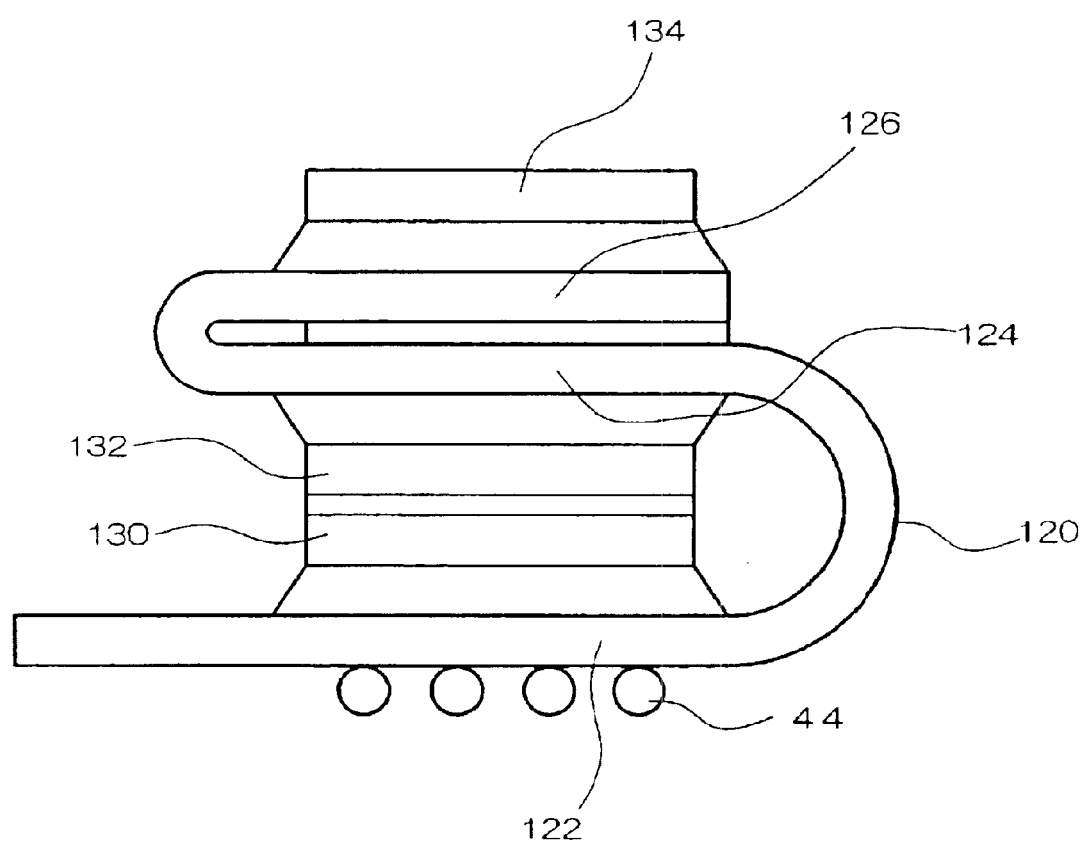
FIG. 9 is illustrative of a semiconductor device according to a fifth embodiment of the present invention.

FIG. 9 is a view showing a semiconductor device according to a fifth embodiment to which the present invention is applied. In the above embodiments, the substrate having the first and second portions are described. The substrate may have a third portion and other portions. A substrate 120 used in the semiconductor device according to the present embodiment includes first to third portions 122, 124, and 126. The description given in the above embodiments is applicable to the first and second portions 122 and 124. Semiconductor chips 130 and 132 are mounted on the first and second portions 122 and 124. In this case, at least one of the semiconductor chips 130 and 132 is mounted in at least either the first portion 122 or the second portion 124.

In the example shown in FIG. 9, the third portion 126 of the substrate 120 extends from the second portion 124. The third portion 126 may extend from the first portion 122. The third portion 126 is shape so as to be superposed on the first portion 122 in the area other than the end parts of the first portion 122 which become the positioning references in the same manner as the second portion 124. Specifically, the third portion 126 has the same structure as the second portion 124. The description given in the above embodiments is applicable to the structure of the first and second portions 122 and 124. The description given in the above embodiments is applicable to the structure of the external terminals 44 and the like.

According to the present embodiment, in addition to the effects described in the above embodiments, a semiconductor device equipped with an increased number of semiconductor chips can be fabricated.

Figure 10:
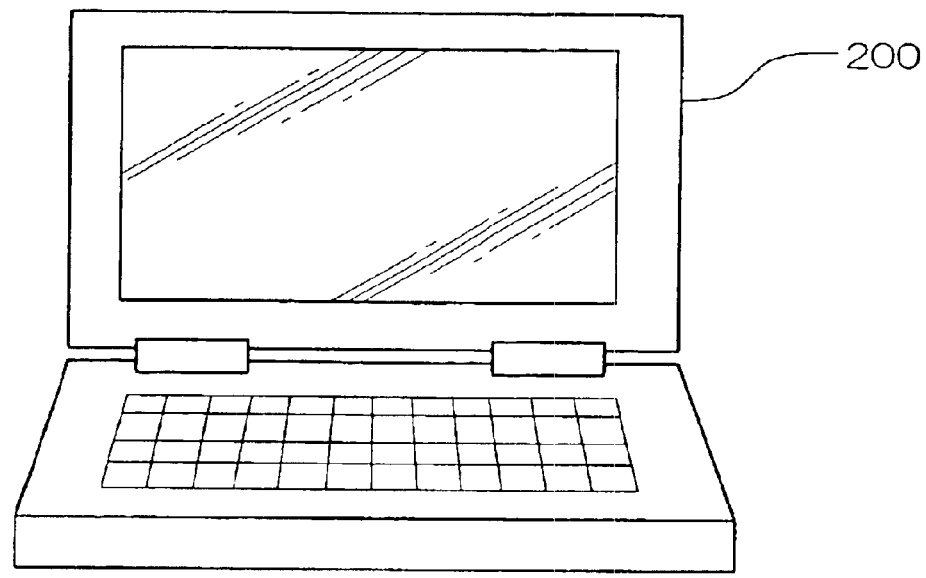
FIG. 10 shows various electronic instruments equipped with the semiconductor device fabricated in accordance with the method of the present invention.
Figure 10:
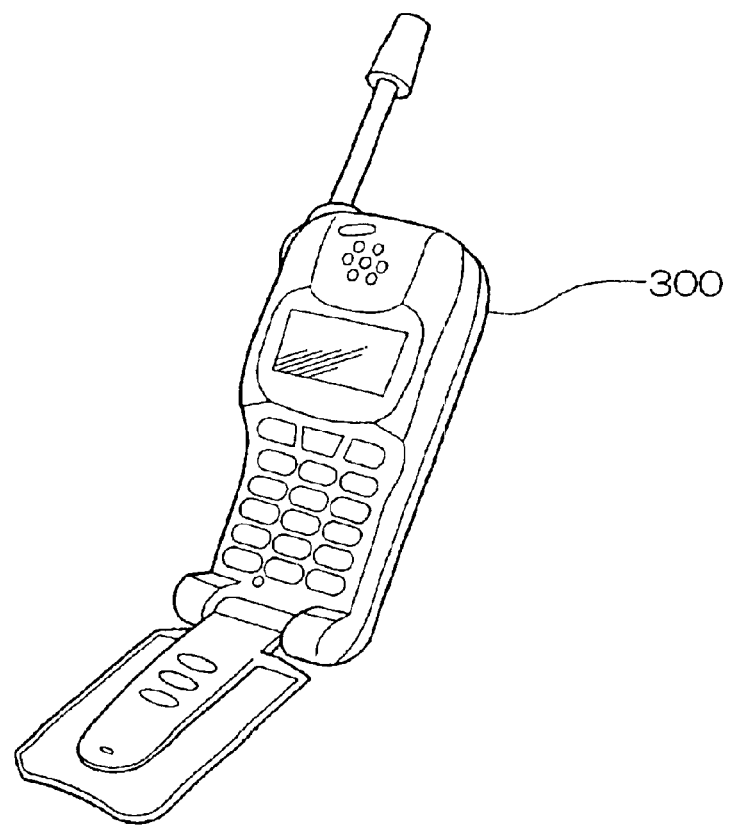

FIG. 10 shows a notebook-type personal computer 200 and a portable telephone 300 as examples of an electronic instrument equipped with the semiconductor device to which the present invention is applied.

In the above-described embodiments, a built-up substrate or a multi-layer substrate may be used as the substrate insofar as the total cost does not increase.

Note that the "semiconductor chip" that is a structural component of the present invention could be replaced by an "electronic element," and electronic elements (either active elements or passive elements) can be mounted on a substrate to fabricate an electronic component, in a manner similar to that of semiconductor chips. Examples of electronic components fabricated by using such electronic elements include optical elements, resistors, capacitors, coils, oscillators, filters, temperature sensors, thermistors, varistors, variable resistors, or fuses, by way of example.

All of the above-described embodiments may be applied to a semiconductor device (or mounted module) in which semiconductor chips and other electronic elements are mounted on a substrate in combination.

In the above-described embodiments, an example in which the substrate is layered by bending the substrate is described. The present invention is not limited to this and is applicable to all methods for layering the substrates. In the case of layering the substrates, upper and lower substrates may be electrically connected using bumps or connectors. In this case, the above-described positioning structure may be formed only on the substrate on which the external terminals are formed (lower substrate) or the substrate layered on the lower substrate. The present invention may be applied to all embodiments other than the case of bending the substrate.

What is claimed is:

1. An interconnect substrate over which an interconnect pattern is formed, comprising:
    a first portion having a rectangular body section; and
    a second portion,
    wherein the first portion has end parts as positioning references, the end parts formed by a plurality of projected sections that project from the rectangular body section and that lie in the same plane as the rectangular body section;
    wherein the second portion has such a shape that when the interconnect substrate is folded only at one boundary of the first and second portions, the second portion is superposed on and inside the first portion.

2. The interconnect substrate as defined in claim 1, wherein each of the end parts as the positioning references includes two edges which are perpendicular to each other.

3. The interconnect substrate as defined in claim 1, wherein one of the projected sections is a region determined by:
    an edge which is a boundary between the projected section and the body section;
    a first edge which is perpendicular to the edge as a boundary; and
    a second top edge which is parallel to the edge as boundary.

4. The interconnect substrate as defined in claim 3, wherein the body section of the first portion includes an edge having no projected section; and
    wherein the second portion is disposed adjacent to the edge having no projected section.

5. The interconnect substrate as defined in claim 1, wherein a plurality of holes are formed in the end parts.

6. The interconnect substrate as defined in claim 1, wherein the second portion continuously extends from the first portion.

7. The interconnect substrate as defined in claim 1, wherein the second portion is separated from the first portion; and
    wherein the first and second portions are connected by the interconnect pattern.

8. A semiconductor device comprising:
    at least one semiconductor chip; and
    a substrate on which the semiconductor chip is mounted, the substrate having a first portion having a rectangular body section and end parts as positioning references, the end parts formed by a plurality of projected sections that project from the rectangular body section and that lie in the same plane as the rectangular body section, the substrate having a second portion, the substrate folded at one boundary of the first and second portions to superpose the second portion on and inside the first portion,
    wherein the second portion has a shape so as to be superposed on and inside the first portion by folding the substrate only at the one boundary of the first and second portions.

9. The semiconductor device as defined in claim 8, wherein a plurality of external terminals are provided in the first portion.

10. The semiconductor device as defined in claim 8, wherein the interconnect substrate as defined in claim 1 is used as the substrate.

11. A circuit board on which is mounted the semiconductor device as defined in claim 8.

12. An electronic instrument provided with the semiconductor device as defined in claim 8.

13. A method of fabricating a semiconductor device, comprising the steps of:
    mounting at least one semiconductor chip over the interconnect substrate as defined in claim 1; and
    superposing the second portion on the first portion of the interconnect substrate.

14. A method of inspecting a semiconductor device, comprising the steps of:
    positioning the semiconductor device as defined in claim 8 by using the end parts as the positioning references; and
    inspecting electrical characteristics of the semiconductor device.

15. A method of mounting a semiconductor device comprising the steps of:
    positioning the semiconductor device as defined in claim 8 by using the end parts as the positioning references; and
    mounting the semiconductor device on a circuit board.

* * * * *